(12) United States Patent  
Tsukamoto

(10) Patent No.: US 8,709,915 B2  
(45) Date of Patent: Apr. 29, 2014

(54) METHOD OF MANUFACTURING SEMICONDUCTOR DEVICE

(76) Inventor: Takeo Tsukamoto, Tokyo (JP)

( * ) Notice: Subject to any disclaimer, the term of this patent is extended or adjusted under 35 U.S.C. 154(b) by 0 days.

(21) Appl. No.: 13/555,223

(22) Filed: Jul. 23, 2012

(65) Prior Publication Data

US 2013/0029475 A1 Jan. 31, 2013

(30) Foreign Application Priority Data

Jul. 27, 2011 (JP) ................................. 2011-164166

(51) Int. Cl.
  *H01L 21/30* (2006.01)
  *H01L 21/46* (2006.01)
(52) U.S. Cl.
  USPC .............. 438/459; 257/E21.214; 257/E21.23; 257/E21.237; 257/E21.304; 257/E21.483; 438/455; 438/458; 438/692; 438/928; 438/977
(58) Field of Classification Search
  USPC ................... 257/E21.214, E21.237, E21.304, 257/E21.483, E21.23; 438/455, 458, 459, 438/692, 928, 977
  See application file for complete search history.

(56) References Cited

U.S. PATENT DOCUMENTS

| 7,883,991 | B1* | 2/2011 | Wu et al. ................. 438/459 |
| 2010/0248427 | A1* | 9/2010 | Wu et al. ................. 438/118 |
| 2010/0255682 | A1* | 10/2010 | Trickett et al. ............. 438/692 |
| 2011/0065238 | A1* | 3/2011 | Chiou et al. .............. 438/107 |
| 2011/0304024 | A1* | 12/2011 | Renna ................. 257/620 |
| 2011/0309647 | A1* | 12/2011 | Yang et al. ............ 294/188 |
| 2012/0238057 | A1* | 9/2012 | Hu et al. .............. 438/107 |
| 2012/0292783 | A1* | 11/2012 | Chiou et al. .............. 257/774 |

FOREIGN PATENT DOCUMENTS

| JP | 2007-123857 | 5/2007 |
| JP | 2011-228419 | 11/2011 |

* cited by examiner

*Primary Examiner* — Asok K Sarkar
(74) *Attorney, Agent, or Firm* — Young & Thompson

(57) ABSTRACT

A method of manufacturing a semiconductor device comprises: forming a protective film so as to cover at least a side edge of a substrate; forming a trench, which is annular in shape when viewed oppositely to a first principal surface of the substrate, on the first principal surface by etching using a photoresist pattern; and forming an insulating film so as to fill the trench, to form an insulating ring.

20 Claims, 15 Drawing Sheets

METHOD OF MANUFACTURING SEMICONDUCTOR DEVICE

This application is based upon and claims the benefit of priority from Japanese Patent Application No. 2011-164166 filed on Jul. 27, 2011, the disclosure of which are incorporated herein in its entirety by reference.

BACKGROUND OF THE INVENTION

1. Field of the Invention

The present invention relates to a method of manufacturing a semiconductor device.

2. Description of the Related Art

The upper and lower semiconductor chips are electrically connected to each other by a through silicon via (TSV) provided so as to penetrate through the semiconductor chips is used, in a semiconductor device in which the functional upgrading is realized by stacking a plurality of semiconductor chips.

In such a semiconductor chip, an insulating ring structure in which a TSV is surrounded by an insulator is used in some cases for the purpose of insulating and isolating the TSV and an element region from each other and reducing capacitance between adjacent TSVs.

JP2007-123857A discloses a method of manufacturing a semiconductor device including a through silicon via provided with an insulating ring. In this patent document, there is disclosed a process of forming an insulating ring firstly (via-first method), and forming TSVs lastly (via-last method) after processes of element formation through to wiring formation. More specifically, a ring-shaped trench is first dug in a depth direction from the element-forming surface side of a silicon substrate, and then this trench is filled with an insulating film to form an insulating ring. Then, the silicon substrate, after processes of element formation on a substrate surface, wiring layer formation, and the like, is ground from the rear surface side thereof to thin the substrate. At this time, a supporting substrate (WSS: Wafer Support System) is provided on a surface of the substrate through an adhesion layer and the rear surface of the substrate is ground until the bottom of the insulating ring becomes exposed out of the rear surface. Consequently, the substrate is formed into a structure in which the insulating ring penetrates through the silicon substrate from the front surface to the rear surface thereof. Then, a TSV is formed inside the insulating ring from the rear surface side of the silicon substrate, so as to penetrate through the substrate.

The insulating ring formed by a via-first method is formed in the substrate to such a depth as to allow the insulating ring to penetrate through the thinned substrate. This depth reaches 30 to 50 μm, which is significantly deep, as compared with an isolation region (for example, an STI) or the like provided likewise by forming a trench in the substrate. A study made by the present inventor has proved that unintended substrate etching occurs in a beveled portion of the outer circumference of the substrate when such a deep trench is formed by a via-first method, and that this serves as a source of dust generation. This condition will be described below with reference to FIGS. 1 and 2.

As illustrated in FIG. 1, side edge (outer circumference; curved portion in the substrate's edge) 2 of substrate 1 in the radial direction thereof is referred to as "beveled portion," and exists so as to surround chip region 3. FIG. 2 is a cross-sectional view illustrating the vicinity of the side edge of substrate 1 illustrated in FIG. 1. When a trench for an insulating ring is formed in the substrate by using photoresist film 4, the photoresist film after development needs to cover the beveled portion. As illustrated in FIG. 2A, unlike a usual principal surface of a substrate, however, a surface of beveled portion 2 is curved so as to connect the front and rear surfaces of the substrate to each other. In such beveled portion 2, an anomaly may arise in a developed pattern of photoresist film 4 on the grounds that the coating properties of photoresist film 4 are uneven, an exposure anomaly occurs due to the irregular reflection of exposure light, or the like. If any places not covered with photoresist film 4 arise in part of the beveled portion at this time due to the above-described anomaly of patterning, unintended etching works upon beveled portion 2 in a trench formation process, as shown by part 5 enclosed by a dotted line in FIG. 2B. This can be a source of dust generation.

As described above, the trench for a TSV insulating ring is particularly deep, and therefore, a large amount of silicon is etched away. Accordingly, the abovementioned dust generation becomes particularly problematic in a process of forming the trench for the insulating ring by a via-first method.

SUMMARY

In one embodiment, there is provided a method of manufacturing a semiconductor device, comprising:

forming a protective film, so as to cover at least a side edge of a substrate;

forming a trench, which is annular in shape when viewed oppositely to a first principal surface of the substrate, on the first principal surface by etching using a photoresist pattern; and forming an insulating film so as to fill the trench, to form an insulating ring.

In another embodiment, there is provided a method of manufacturing a semiconductor device, comprising:

forming a trench in a first principal surface of a substrate;

bonding a supporting substrate a side edge of which is covered with a protective film onto the first principal surface of the substrate through an adhesion layer; and grinding the substrate from a side of a surface of the substrate opposed to the first principal surface thereof in a thickness direction of the substrate, to expose a bottom of the trench.

In another embodiment, there is provided a method of manufacturing a semiconductor device, comprising:

attaching a supporting substrate to a first principal surface of a wafer, the supporting substrate having a diameter larger than that of the wafer and including a side edge covered with a protective film, the wafer including a trench formed in the first principal surface thereof; and etching the wafer from a second principal surface opposed to the first principal surface to expose the trench under a condition that the supporting substrate is attached to the wafer.

BRIEF DESCRIPTION OF THE DRAWINGS

The above features and advantages of the present invention will be more apparent from the following description of certain preferred embodiments taken in conjunction with the accompanying drawings, in which.

Figure 1:
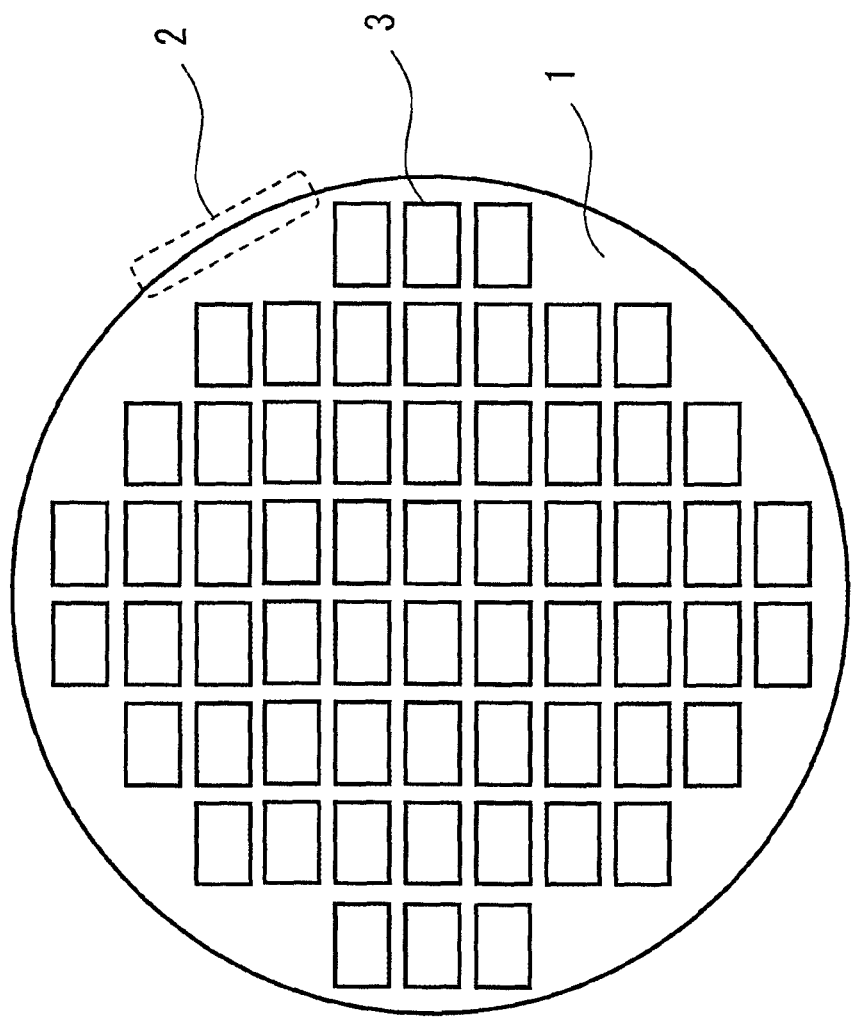
FIG. 1 is a schematic view used to describe a beveled portion.
Figure 2:
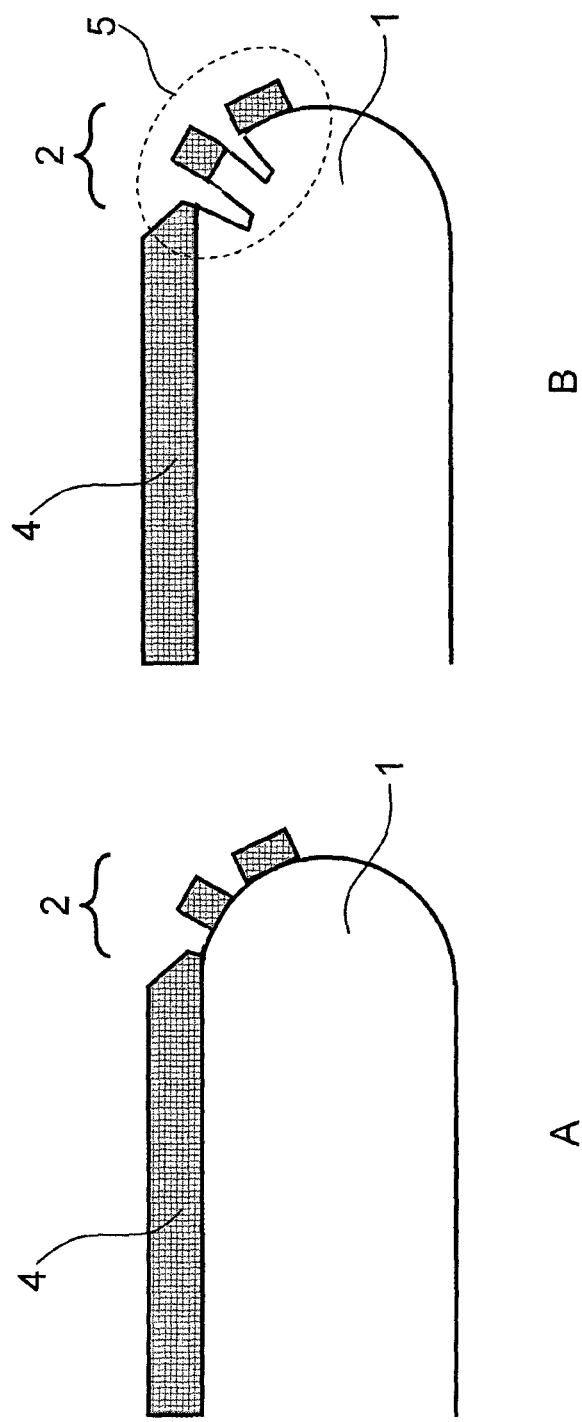
FIG. 2 is a group of cross-sectional views illustrating the vicinity of a beveled portion of a substrate when a manufacturing method of the related art is used.
Figure 3:
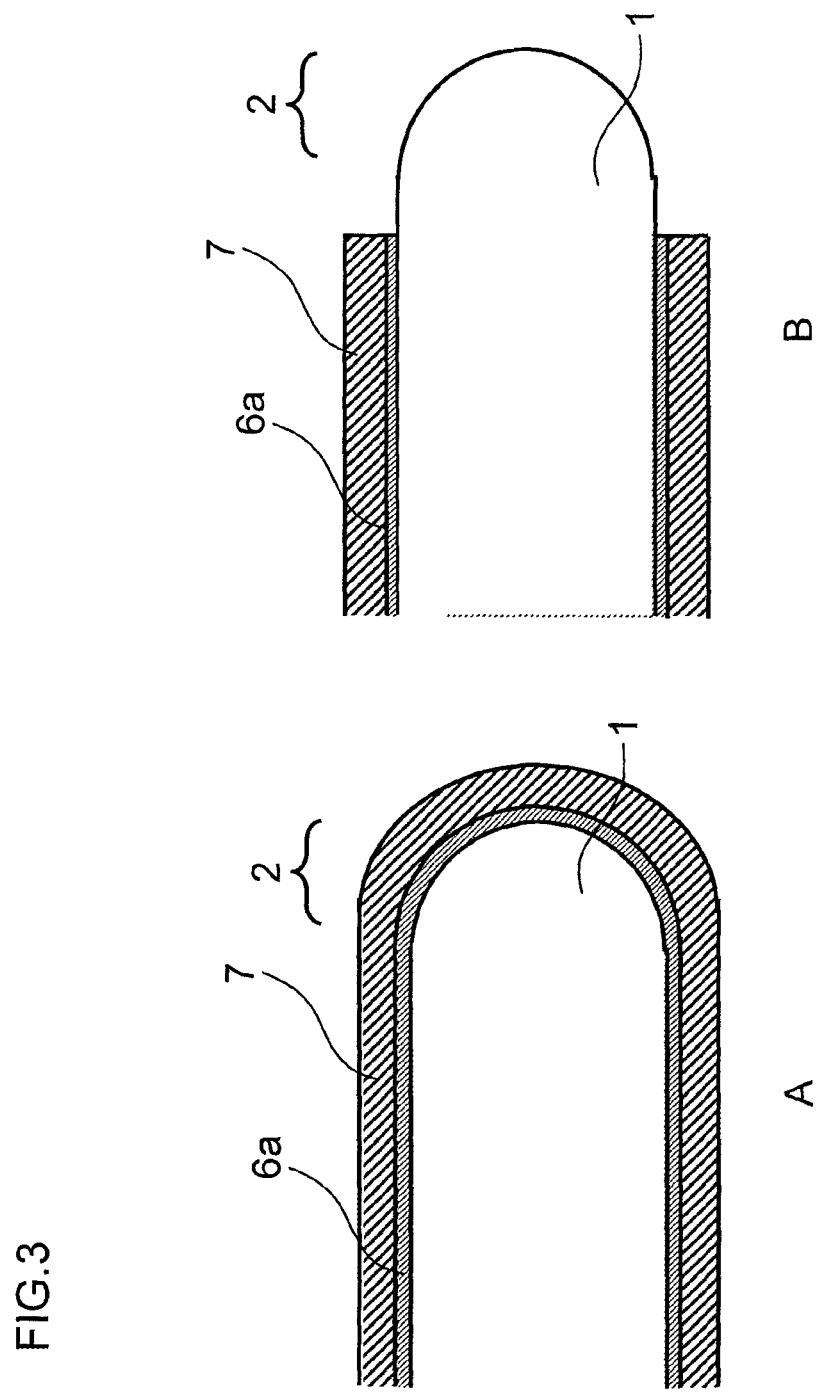
FIG. 3 is a schematic view illustrating a method of manufacturing a semiconductor device according to a first exemplary embodiment.
Figure 4:
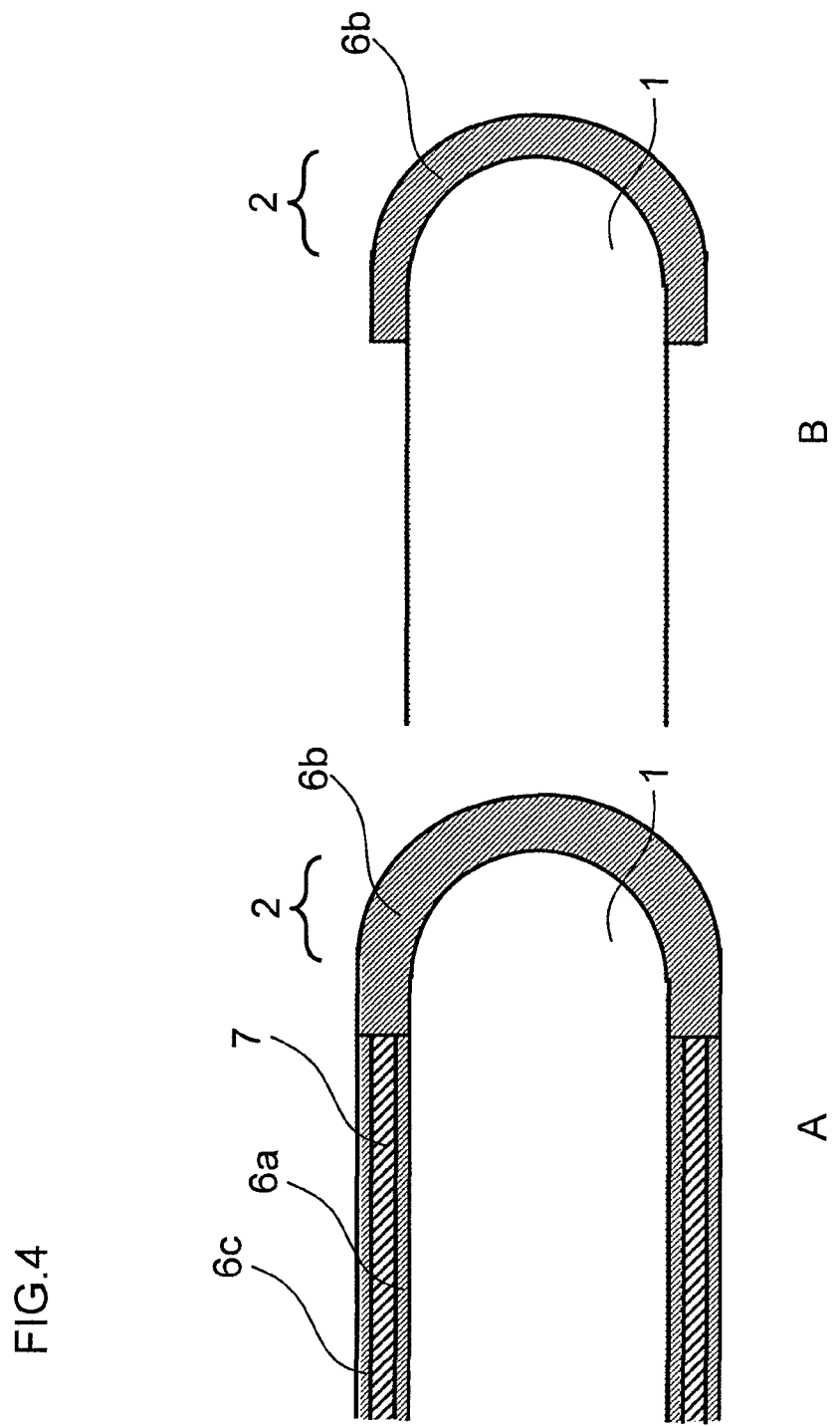
FIG. 4 is another schematic view illustrating the method of manufacturing the semiconductor device according to the first exemplary embodiment.

In the drawings, numerals have the following meanings, 1: substrate, 2: side edge (beveled portion), 3: chip region, 4: hard mask, 6a: silicon oxide film, 6b: silicon oxide film (protective film), 7: silicon nitride film (first film), 9a: first principal surface, 9b: second principal surface, 10: trench, 11a, 11b, 11c, 11d, 11e: interlayer insulating film, 12: wiring layer, 13: protective film, 14: polyimide film, 15: front-surface plated layer, 16: front-surface bump, 17, 20: seed layer, 18: second substrate, 19: adhesion layer, 21: rear-surface bump, 22: rear-surface plated layer, 23: surface opposed to first principal surface, 25: insulating ring, 26, 30: silicon nitride film, 27: through silicon via, 28: element region, 29: through silicon via region, 33: chemical solution, 35: underfill, 37: molding resin, 38: solder ball, and 39: package substrate.

DETAILED DESCRIPTION OF THE PREFERRED EMBODIMENTS

In a method of manufacturing a semiconductor device, a protective film is formed so as to cover at least a side edge of a substrate (curved portion of an edge (outer circumference) in a radial direction in the case of a circular substrate; beveled portion; side-surface edge of the substrate). Next, a trench, which is annular in shape when viewed oppositely to the first principal surface, is formed on a first principal surface of the substrate by etching using a photoresist pattern. Thereafter, an insulating film is formed so as to fill the trench, thereby forming an insulating ring.

When the substrate is etched in the forming the trench, a photoresist film is formed on the substrate and subjected to exposure. At this time, the coating properties of the photoresist film become uneven or an exposure anomaly occurs due to the irregular reflection of exposure light because the side edge of the substrate is curved. As a result, an anomaly arises in the developed pattern of the photoresist film. Even in a case where an anomaly arises in the developed pattern as described above, the side edge of the substrate is covered with the protective film, and therefore, not exposed. Consequently, dust generation due to unintended side edge etching can be prevented even when the substrate is etched in the forming the trench. As a result, it is possible to prevent the degradation of device characteristics due to dust and improve yielding percentage.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

FIGS. 3 to 12 are schematic views used to describe a manufacturing method according to a first exemplary embodiment. Processes of FIGS. 3 to 12 are roughly classified into a beveled portion treatment process of treating a side edge (beveled portion) of a semiconductor substrate and a through silicon via formation process of forming an insulating ring and a through silicon via. For ease of description, only the vicinity of the side edge of the semiconductor substrate will be shown in FIGS. 3 to 5 to describe the beveled portion treatment process. Likewise, only the chip region of the semiconductor substrate will be shown in FIGS. 6 to 12 to describe the through silicon via formation process.

As illustrated in FIG. 3A, silicon oxide film 6a is formed on semiconductor substrate 1 by thermal oxidation. Subsequently, silicon nitride film 7 (first film) is formed on silicon oxide film 6a by a CVD method or the like. As illustrated in FIG. 3B, the side edge of the substrate and portions of silicon nitride film 7 on the vicinity of the side edge are removed by bevel dry etching. The bevel dry etching is performed using, for example, a dry etcher for bevels and at least one type of gas selected from the group consisting of $SF_6$, $CF_4$, $N_2$ and $CO_2$. The dry etcher for bevels as referred to here is an etcher capable of plasma irradiation onto only the vicinity of the beveled portion, and is widely used already. Consequently, side edge 2 of the semiconductor substrate becomes exposed. In the process of FIG. 3B, portions of silicon nitride film 7 on the substrate's side edge and on a flat part in the vicinity thereof (for example, an area 1 mm or more inward from the side edge in the radial direction of the semiconductor substrate) were removed to allow for a margin of removal. In the present exemplary embodiment, all that has to be done is to remove at least portions of silicon nitride film 7 on the side edge of the substrate which is a curved portion thereof.

As illustrated in FIG. 4A, side edge 2 of the semiconductor substrate and portions in the vicinity thereof are thermally oxidized to form silicon oxide film 6b (protective film; thermally-oxidized film). The thickness of silicon oxide film 6b is set to, for example, 200 to 300 nm. As illustrated in FIG. 4B, since a several nm-thick thin silicon oxide film 6c is also formed on a surface of silicon nitride film 7 at the time of thermal oxidation, silicon oxide film 6c is etched away. Silicon oxide film 6b, although also being partially removed at this time, remains on side edge 2 of the semiconductor substrate because silicon oxide film 6b is thicker than silicon oxide film 6c. Next, the remaining portions of silicon nitride film 7 and silicon oxide film 6a are removed by etching.

Figure 5:
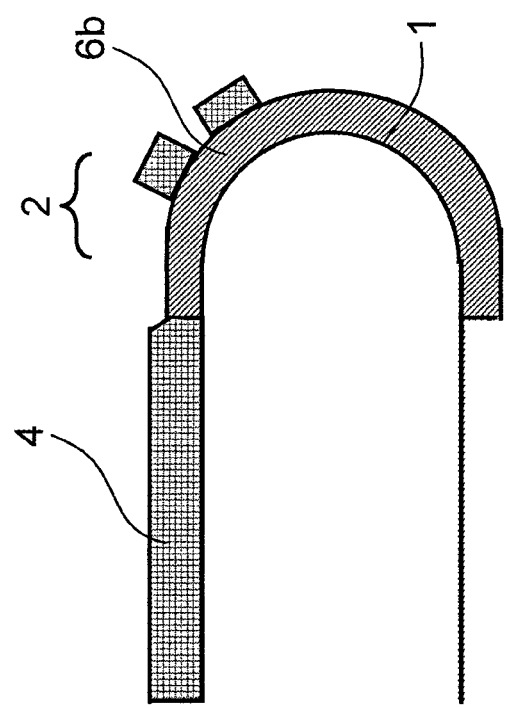
FIG. 5 is yet another schematic view illustrating the method of manufacturing the semiconductor device according to the first exemplary embodiment.

As illustrated in FIG. 5, exposed surfaces of semiconductor substrate 1 are thermally oxidized to form a silicon oxide film (not illustrated). Photoresist film 4 is formed on semiconductor substrate 1 and subjected to exposure to form a photoresist pattern. Next, semiconductor substrate 1 is etched using photoresist pattern 4 to form, on the first principal surface of the semiconductor substrate, a trench for an insulating ring which is annular in shape when viewed oppositely to the first principal surface. At this time, silicon oxide film 6b remains on side edge 2 of semiconductor substrate 1 and on the vicinity thereof, without being removed due to a difference in etching rate between silicon oxide film 6b and semiconductor substrate 1.

Figure 6:
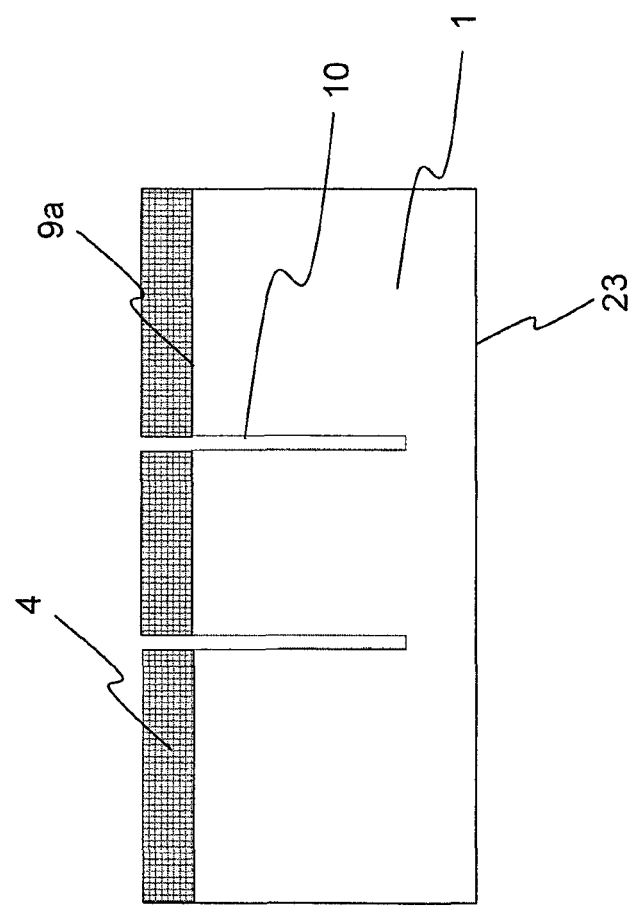
FIG. 6 is still another schematic view illustrating the method of manufacturing the semiconductor device according to the first exemplary embodiment.

FIG. 6 is a schematic view illustrating a chip region in this process. The depth of trench 10 can be set to, for example, 30 to 50 μm. Since the insulating ring is formed by a via-first method in the present exemplary embodiment, the bottom surface of trench 10 is located within semiconductor substrate 1, without being exposed out of surface 23 opposed to the first principal surface of semiconductor substrate 1. That is, trench 10 does not penetrate through semiconductor substrate 1 in the thickness direction thereof.

When the photoresist pattern is formed, the coating properties of photoresist film 4 become uneven or an exposure anomaly arises due to the irregular reflection of exposure light because side edge 2 of the semiconductor substrate is curved. As a result, an anomaly arises in the developed pattern of photoresist film 4. Consequently, in a conventional semiconductor substrate, the side edge thereof becomes exposed. If the semiconductor substrate is etched using such photoresist film 4 in a conventional method, dust is generated due to the etching of exposed surfaces of side edge 2 of the semiconductor substrate. This has been a cause for degradation in the yield of the semiconductor device.

In contrast, in the present exemplary embodiment, side edge 2 of the semiconductor substrate is covered with silicon oxide film 6b and therefore, not exposed even in a case where such an anomaly as described above arises. Consequently, dust generation due to unintended side edge etching can be prevented even when a deep trench for an insulating ring is formed by etching in the process of FIG. 6. As a result, it is possible to prevent the degradation of device characteristics due to dust and improve yielding percentage.

Figure 7:
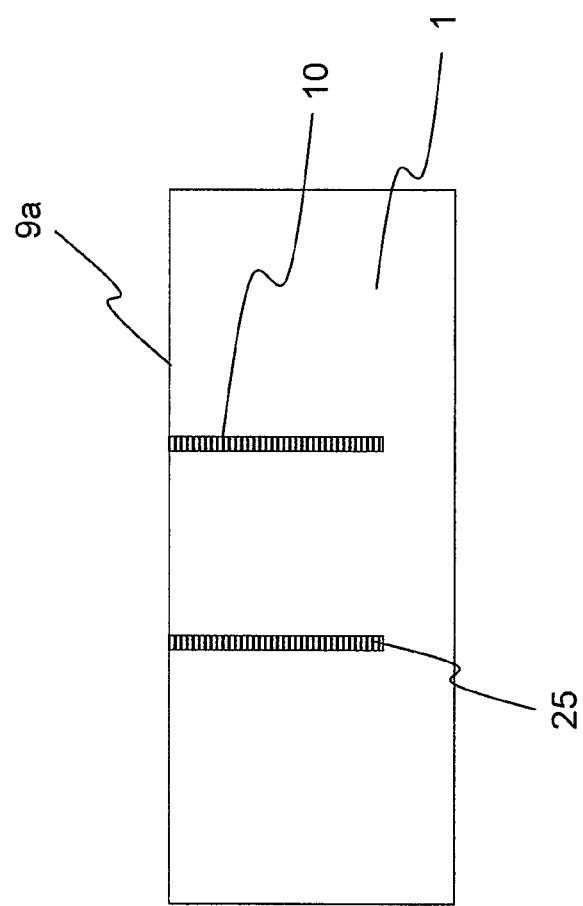
FIG. 7 is still another schematic view illustrating the method of manufacturing the semiconductor device according to the first exemplary embodiment.

As illustrated in FIG. 7, photoresist pattern 4 is removed, and then the inner sidewall surface of the trench is thermally oxidized to form a silicon oxide film (insulating film). A silicon nitride film (insulating film) is formed by a CVD method or the like, so as to fill trench 10. Annular insulating ring 25 is formed by performing a CMP treatment. A boundary between the silicon oxide film and the silicon nitride film is not shown in the drawings presented in FIG. 7 and subsequent figures. A semiconductor element (not illustrated), such as an MIS transistor, is formed on the first principal surface 9a side of semiconductor substrate 1.

Figure 8:
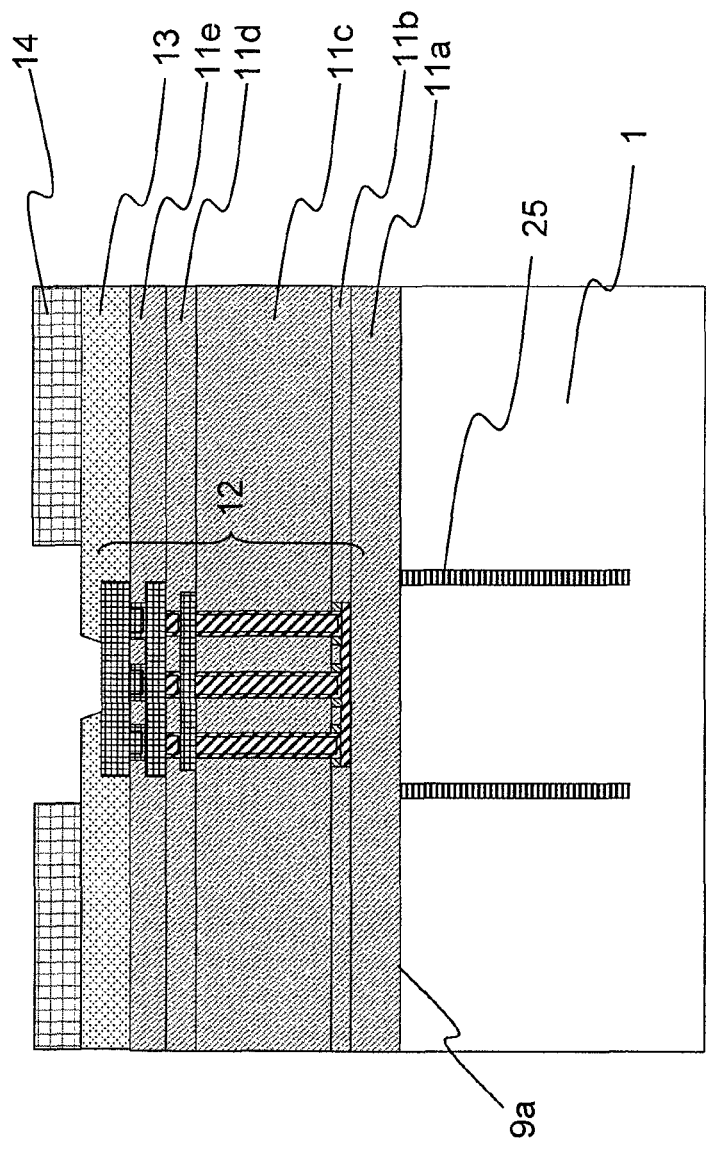
FIG. 8 is still another schematic view illustrating the method of manufacturing the semiconductor device according to the first exemplary embodiment.

As illustrated in FIG. 8, interlayer insulating films 11a to 11e are sequentially formed on first principal surface 9a of semiconductor substrate 1. A plurality of wirings are formed and a plurality of contact plugs are formed so as to connect a plurality of wirings to one another and make connections among them, partway through the formation of these interlayer insulating films. Consequently, there is formed wiring layer 12. Protective film 13 is formed on interlayer insulating film 11e. Polyimide film 14 is formed on protective film 13, and is then patterned. By etching using polyimide film 14 as a mask, an opening is formed in protective film 13, so that an upper portion of wiring layer 12 becomes exposed.

Figure 9:
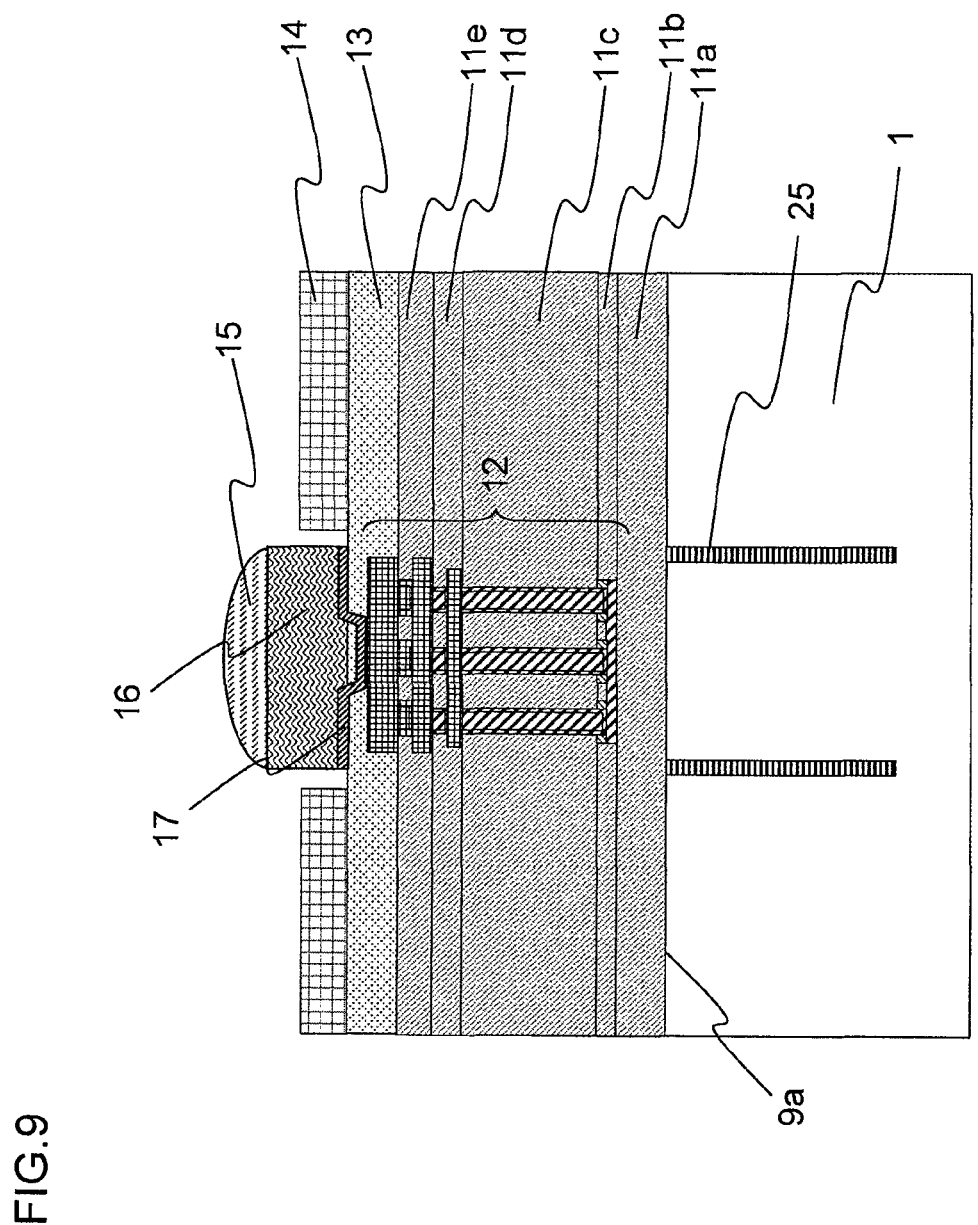
FIG. 9 is still another schematic view illustrating the method of manufacturing the semiconductor device according to the first exemplary embodiment.

As illustrated in FIG. 9, seed layer 17 is formed on wiring layer 12 by using a sputtering method. A photoresist pattern (not illustrated) is formed on seed layer 17, so that portions of seed layer 17 on wiring layer 12 become exposed. Using a plating method, front-surface bump 16 and front-surface plated layer 15 are formed on seed layer 17. The photoresist pattern is removed, and then the exposed portions of seed layer 17 are removed. Front-surface plated layer 15 is heated by a reflow method to form an upper surface thereof into a dome-like shape. This seed layer 17, front-surface bump 16, and front-surface plated layer 15 constitute a front-surface electrode.

Figure 10:
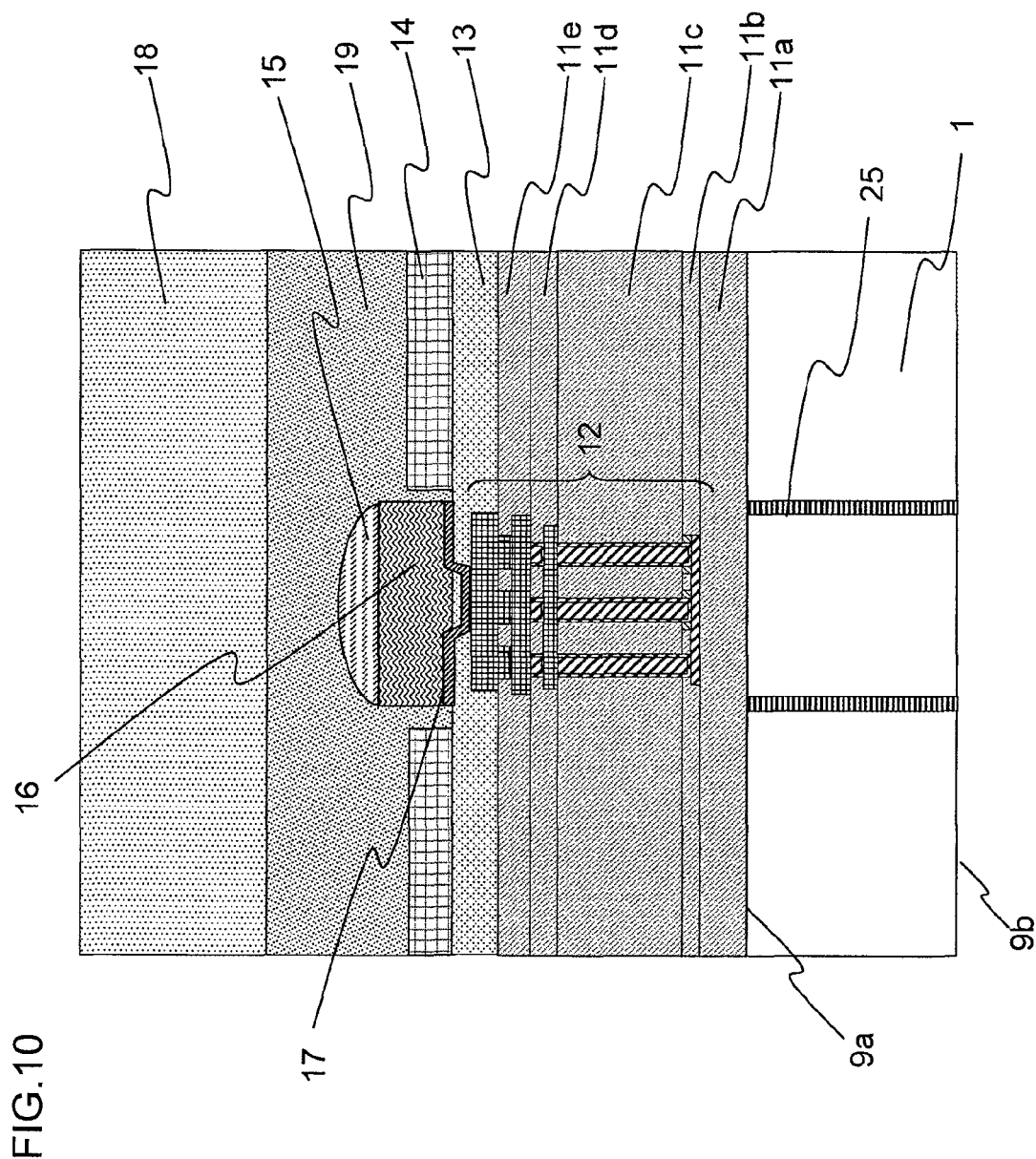
FIG. 10 is still another schematic view illustrating the method of manufacturing the semiconductor device according to the first exemplary embodiment.
Figure 11:
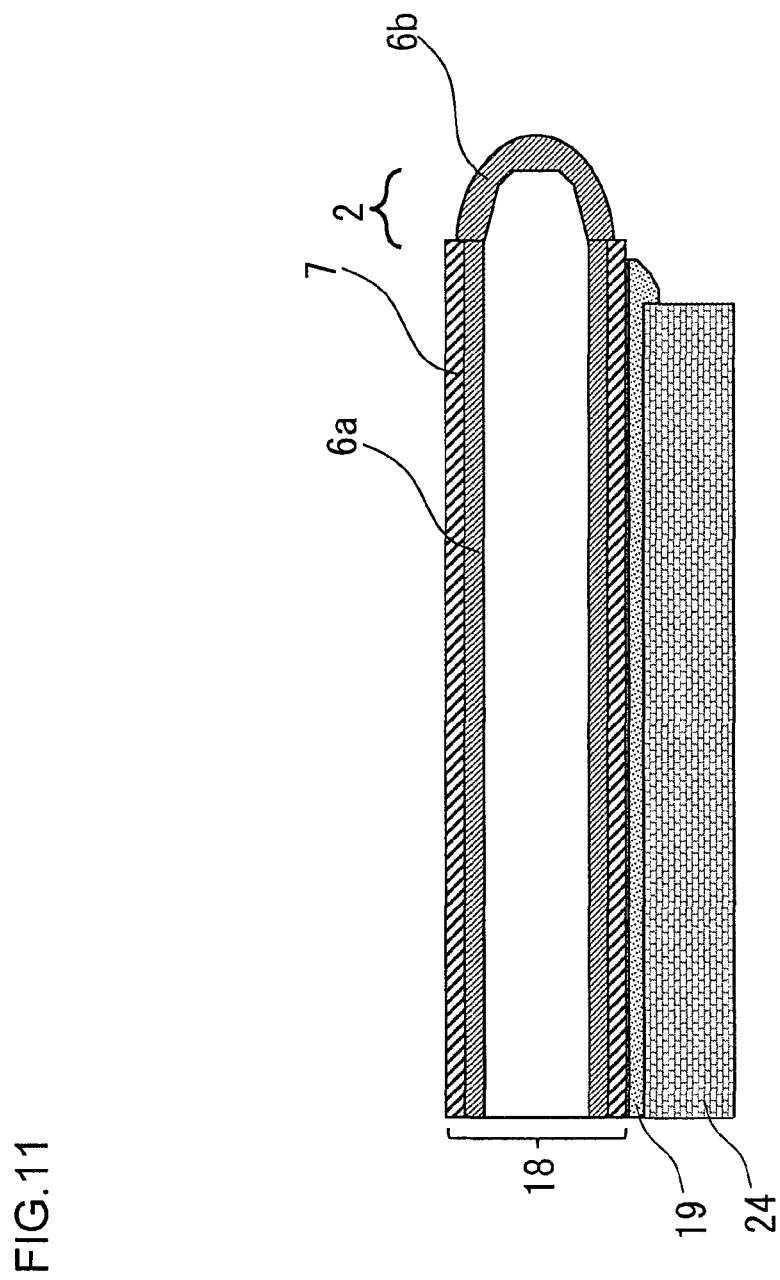
FIG. 11 is still another schematic view illustrating the method of manufacturing the semiconductor device according to the first exemplary embodiment.

As illustrated in FIG. 10, supporting substrate (WSS: wafer support system) 18 is bonded to semiconductor substrate 1 through adhesion layer 19, so as to cover front-surface plated layer 15 and polyimide film 14. At this time, there is used supporting substrate 18 in which a protective film is formed on the side edge (curved portion in an edge (outer circumference) in a radial direction in the case of a circular substrate; beveled portion; side-surface edge of the substrate) thereof, as in the semiconductor substrate. FIG. 11 schematically represents this condition. As illustrated in FIG. 11, silicon oxide film 6a and silicon nitride film (first film) 7 are sequentially formed on supporting substrate 18 by thermal oxidation, in the same way as they are formed on semiconductor substrate 1. Thereafter, portions of silicon nitride film 7 on side edge 2 are removed by dry etching. Next, side edge 2 of supporting substrate 18 is thermally oxidized to form silicon oxide film (protective film; thermally-oxidized film) 6b on side edge 2 of supporting substrate 18. FIG. 10 only schematically illustrates supporting substrate 18, and does not show any detailed structures of the first film and silicon oxide films 6a and 6b, and the like. In addition, FIG. 11 only schematically illustrates semiconductor substrate 1 and interlayer insulating films 11a to 11e and the like provided thereon as layer 24.

A surface of semiconductor substrate 1 on the opposite side of first principal surface 9a thereof is ground to thin semiconductor substrate 1, thereby exposing the bottom of insulating ring 25. In this grinding, semiconductor substrate 1 is ground to a depth of several hundred μm by whetstone polishing or CMP (chemical-mechanical polishing method), so as to be several ten μm thick. At this time, as illustrated in FIG. 11, supporting substrate 18 larger in diameter than semiconductor substrate 1 is used, for the purpose of preventing misalignment from arising in bonding or an adhesive agent from running off. Consequently, side edge 2 of supporting substrate 18 protrudes outward when viewed from the rear surface side of semiconductor substrate 1. Since the semiconductor substrate is ground to a thickness on the order of several hundred μm in the grinding process, substrate grinding is performed under strict conditions. Accordingly, the protruding side edge is also ground by this grinding if a conventional supporting substrate is used, thus generating dust. In addition, the protruding side edge is ground, and therefore, dust is generated in some cases also when semiconductor substrate 1 is etched from the rear surface side in order to form a through silicon via.

In contrast, in the present exemplary embodiment, side edge 2 of supporting substrate 18 is covered with silicon oxide film 6b. Consequently, it is possible to prevent supporting substrate 18 from being ground and dust from being generated even if semiconductor substrate 1 is ground or the rear surface thereof is etched under the abovementioned strict conditions. As a result, it is possible to prevent the degradation of device characteristics due to dust and improve yielding percentage.

Figure 12:
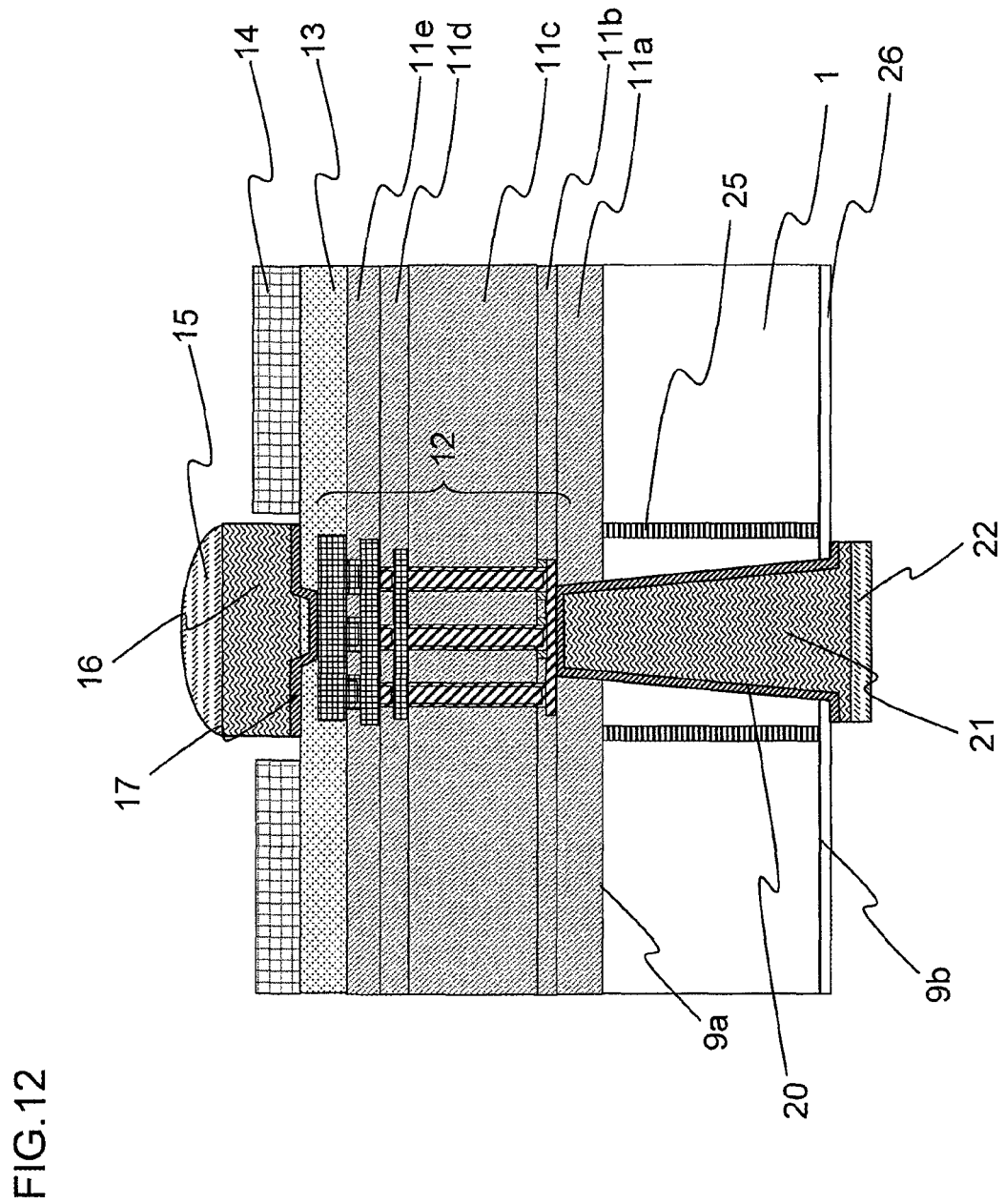
FIG. 12 is still another schematic view illustrating the method of manufacturing the semiconductor device according to the first exemplary embodiment.

As illustrated in FIG. 12, silicon nitride film 26 is formed on second principal surface 9b of semiconductor substrate 1 on the opposite side of first principal surface 9a thereof. By photolithography and dry etching, there is formed, inside insulating ring 25, a bump hole penetrating through silicon nitride film 26 and semiconductor substrate 1 to expose part of wiring layer 12. Since the protruding side edge of the supporting substrate is covered with silicon oxide film 6b also at the time of this etching, it is possible to prevent dust from being generated out of the side edge. Next, inner walls of the bump hole are covered with seed layer 20 formed by a sputtering method, and then rear-surface bump 21 and rear-surface plated layer 22 are formed by a plating method. Thereafter, extra portions of seed layer 20, rear-surface bump 21 and rear-surface plated layer 22 are removed. A dicing film (not illustrated) is attached to second principal surface 9b of semiconductor substrate 1. After supporting substrate 18 is separated off, adhesion layer 18 is removed from semiconductor substrate 1. Thus, front-surface bump 16 and front-surface plated layer 15 of semiconductor substrate 1 are exposed. As illustrated in FIG. 12, a front-surface electrode is formed of three layers, i.e., seed layer 17, front-surface bump 16, and front-surface plated layer 15. A rear-surface electrode is formed of three layers, i.e., seed layer 20, rear-surface bump 21, and rear-surface plated layer 22. The rear-surface electrode and the front-surface electrode are connected to each other by wiring layer 12.

Next, a wafer is cut by a dicer and chips cut off and separated from the wafer are picked up to peel off the dicing film from semiconductor substrate 1, thereby exposing rear-surface bump 21 and rear-surface plated layer 22.

Figure 13:
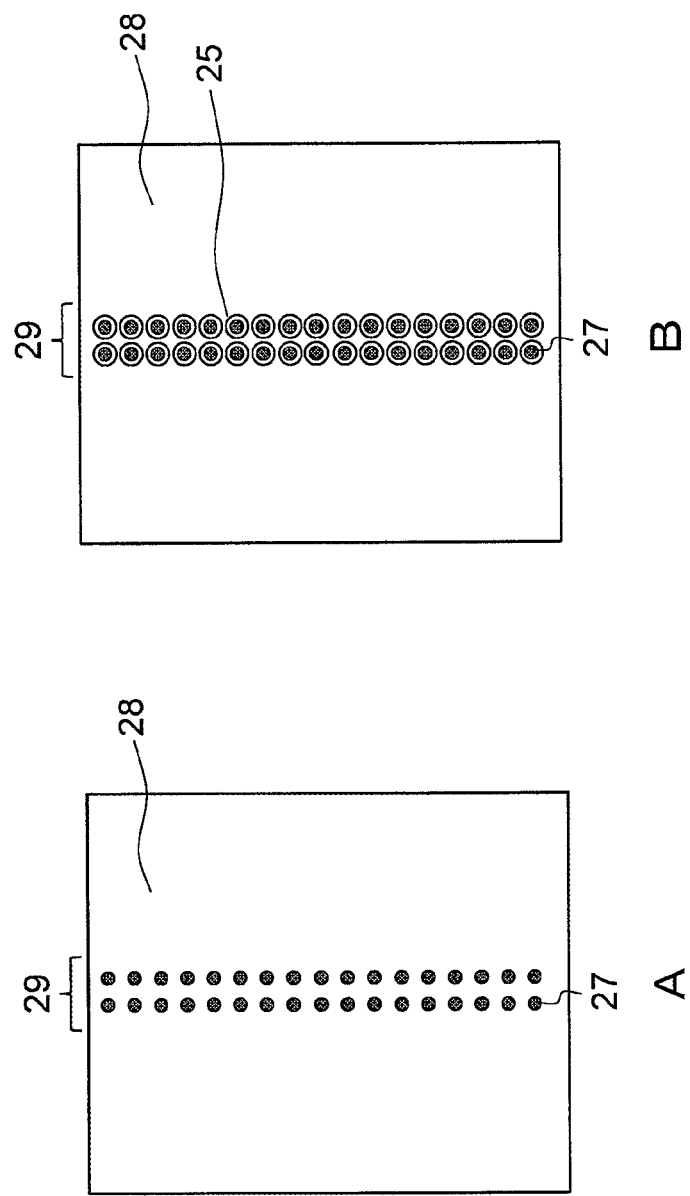
FIG. 13 is still another schematic view illustrating the method of manufacturing the semiconductor device according to the first exemplary embodiment.

FIG. 13 illustrates a semiconductor chip obtained after being cut off. FIG. 13A is plan view taken from the first principal surface side of the semiconductor chip, whereas FIG. 13B is a plan view taken from the second principal surface side of the semiconductor chip on the opposite side of the first principal surface thereof. In FIGS. 13A and 13B, however, only principal structural members, such as through silicon vias, are shown. As illustrated in FIG. 13, the semiconductor chip includes an element region 28 in which MIS transistors and the like are formed, and a through silicon via region 29 in which a plurality of through silicon vias are formed. Each through silicon via 27 comprises electrodes for connecting at the upper and lower ends thereof. Consequently, semiconductor chips disposed vertically through the through silicon via are electrically connected to each other when a plurality of semiconductor chips are stacked. The through silicon via is composed of a front-surface electrode and a rear-surface electrode penetrating through the semiconductor substrate, and a wiring layer penetrating through a plurality of interlayer insulating films on the semiconductor substrate. Insulating ring 25 is provided around a portion of the through silicon via buried in semiconductor substrate 1. This insulating ring ensures insulation of each through silicon via from other through silicon vias and from elements.

Figure 14:
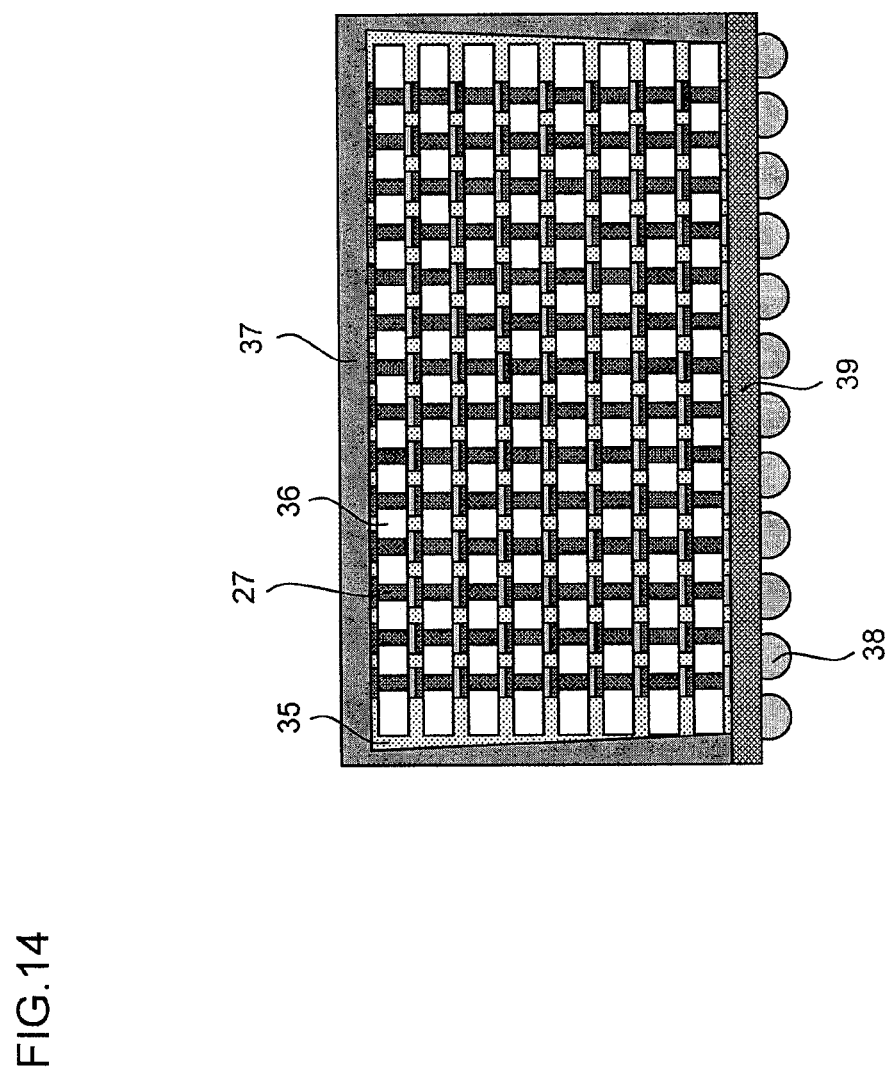
FIG. 14 is still another schematic view illustrating the method of manufacturing the semiconductor device according to the first exemplary embodiment.

As illustrated in FIG. 14, a plurality of semiconductor chips are mounted, so that the front-surface electrodes and rear-surface electrodes of different semiconductor chips have contact with one another. Respective front-surface plated layers and respective rear-surface plated layers are joined together by reflow. After underfill 35 is filled among the semiconductor chips, the plurality of semiconductor chips are mounted on package substrate 39. Thereafter, the resultant device is molded using molding resin 37, thereby completing the semiconductor device of the present exemplary embodiment. Examples of the semiconductor device of the present exemplary embodiment may include memory devices, such as a DRAM, an SRAM and a flash memory, and arithmetic processing devices, such as an MPU and a DSP.

In the above-described processes of FIGS. 3B, 10 and 11, silicon nitride films (first films) on the side edges of the semiconductor substrate and supporting substrate are removed by dry etching. However, such a method as wet etching, sublimation, polishing or cleaning may be used, in place of dry etching, in order to remove these films.

Figure 15:
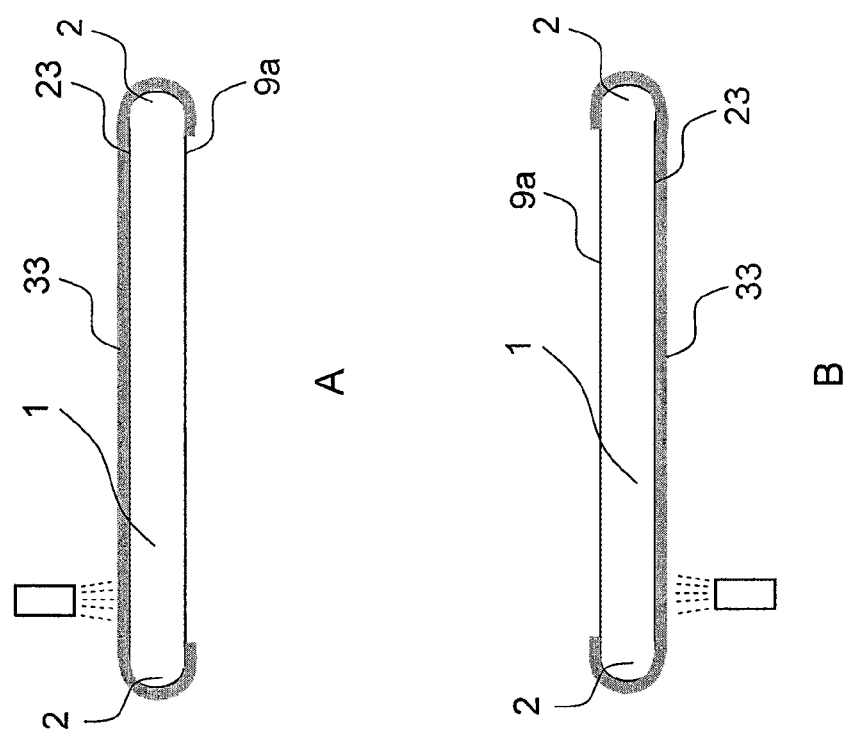
FIG. 15 is a modified example of the method of manufacturing the semiconductor device according to the first exemplary embodiment.

Wet etching may be selectively performed on the silicon nitride films on the side edges from the first principal surface side, or may be performed on the side edges by applying chemical solution 33 to the rear surface side of the semiconductor substrate. FIG. 15 illustrates an example of removing the silicon nitride film on the side edge of the semiconductor substrate by wet etching in which chemical solution 33 is applied from the rear surface side. In the figure, a mask is omitted. As illustrated in FIG. 15A, the semiconductor substrate may be flipped over, so that first principal surface 9a is the lower side of the semiconductor substrate. Then, wet etching can be performed by applying chemical solution 33 to surface 23 on the opposite side of the first principal surface. Alternatively, as illustrated in FIG. 15B, wet etching may be performed by applying chemical solution 33 to surface 23 on the opposite side of the first principal surface, with the vertical position of the semiconductor substrate left as is. In the case of either FIG. 15A or 15B, the chemical solution has predetermined ranges of viscosity and wettability with respect to semiconductor substrate 1. Accordingly, chemical solution 33 also migrates to the first principal surface 9a side of semiconductor substrate 1 and covers the entire range of side edge 2, thereby enabling the wet etching of the side edge. By performing wet etching as illustrated in FIG. 15, the silicon nitride film (first film) on side edge 2 can be removed without adversely affecting elements provided in the chip region on the first principal surface side. It is also possible to remove any foreign substances adhered to the rear surface side.

In sublimation, the silicon nitride films (first films) on the side edges of the semiconductor substrate and supporting substrate are heated with a burner using a gas, such as $NF_3$, $H_2$ or $O_2$, thereby removing these films.

In polishing, the silicon nitride films (first films) on the side edges of the semiconductor substrate and supporting substrate are scraped off the films by using an abrasive tape, thereby removing these films.

In cleaning, the silicon nitride films (first films) on the side edges of the semiconductor substrate and supporting substrate are cleaned off by using a sponge or the like, thereby removing these films.

Second Exemplary Embodiment

In the first exemplary embodiment, a manufacturing method has been shown in which a through silicon via is formed after an insulating ring is previously formed. The present exemplary embodiment is concerned with a semiconductor device manufacturing method in which no insulating rings are formed. In the present exemplary embodiment, a semiconductor device can be manufactured in the same way as in the first exemplary embodiment, except that the processes of FIGS. 3 to 7 in the first exemplary embodiment are not carried out. Accordingly, respective manufacturing processes will not be described here.

In the present exemplary embodiment, supporting substrate 18 including a protective film on the side edge thereof is used in the process of bonding supporting substrate 18 to semiconductor substrate 1 and grinding a surface of semiconductor substrate 1 on the opposite side of first principal surface 9a thereof illustrated in FIGS. 10 and 11. Thus, it is possible to prevent the side edge of supporting substrate 18 from being ground to generate dust at the time of grinding semiconductor substrate 1, in the same way as in the first exemplary embodiment. As a result, it is possible to prevent the degradation of device characteristics due to dust and improve yielding percentage.

The following manufacturing method can also be used as a modified example of the present exemplary embodiment. In this modified example, a through silicon via as a whole is previously formed on the first principal surface 9a side of semiconductor substrate 1. Then, supporting substrate 18 is bonded onto first principal surface 9a. Thereafter, a surface of semiconductor substrate 1 on the opposite side of first principal surface 9a thereof is ground to expose the through silicon via. Also in this modified example, a protective film is provided on a side edge of supporting substrate 18 used in the process of grinding the surface of semiconductor substrate 1 on the opposite side of first principal surface 9a thereof. Accordingly, the present modified example can exert the same advantageous effect as the second exemplary embodiment.

It is apparent that the present invention is not limited to the above embodiments, but may be modified and changed without departing from the scope and spirit of the invention.

What is claimed is:

1. A method of manufacturing a semiconductor device, comprising:
    forming a protective film, so as to cover a side edge of a substrate and a first principal surface of the substrate;
    removing the protective film formed on the first principal surface of the substrate such that the protective film remains on a whole of the side edge of the substrate;
    forming a trench, which is annular in shape when viewed oppositely to the first principal surface of the substrate, on the first principal surface by etching using a photoresist pattern; and
    forming an insulating film so as to fill the trench, to form an insulating ring.

2. The method according to claim 1, wherein the forming the protective film occurs before the forming the trench, and the forming the insulating film occurs after the forming the trench, and,
    wherein the method further comprises, after forming the insulating film, grinding the substrate from a side of a surface of the substrate opposed to the first principal surface thereof in a thickness direction of the substrate and exposing a bottom of the insulating ring.

3. The method according to claim 1, further comprising, after forming the insulating film:
    forming a wiring layer and a front-surface electrode above a portion of the substrate located inside the insulating ring; and
    obtaining a through silicon via by forming a rear-surface electrode so as to penetrate through the substrate to be connected to the wiring layer, from a side of a surface of the substrate opposed to the first principal surface thereof in a thickness direction of the substrate.

4. The method according to claim 3, further comprising, after the forming the wiring layer and the front-surface electrode and before the obtaining the through silicon via:
    bonding a supporting substrate, a side edge of which is covered with a protective film, onto the first principal surface of the substrate through an adhesion layer; and
    grinding the substrate from the side of the surface of the substrate opposed to the first principal surface thereof in the thickness direction of the substrate, to expose a bottom of the insulating ring.

5. The method according to claim 4, wherein the protective film of the supporting substrate is a silicon oxide film.

6. The method according to claim 1, further comprising, before forming the protective film:
    forming a first film on the substrate; and
    removing at least a portion of the first film on the side edge of the substrate.

7. The method according to claim 6, wherein in the removing at least the portion of the first film, at least the portion of the first film on the side edge of the substrate is removed by dry etching.

8. The method according to claim 7, wherein in the removing at least the portion of the first film, the dry etching is performed using at least one type of gas selected from the group consisting of $SF_6$, $CF_4$, $N_2$ and $CO_2$.

9. The method according to claim 6, wherein in the removing at least the portion of the first film, at least the portion of the first film on the side edge of the substrate is removed by wet etching.

10. The method according to claim 9, wherein in the removing at least the portion of the first film, the wet etching is performed by applying a chemical solution from a side of a surface of the substrate opposed to the first principal surface thereof in a thickness direction of the substrate.

11. The method according to claim 6, wherein the first film is a silicon nitride film.

12. The method according to claim 6, wherein the first film is a laminated film including a silicon oxide film and a silicon nitride film on the silicon oxide film.

13. The method according to claim 1, wherein in the forming the protective film, a thermally-oxidized film is formed by thermal oxidation as the protective film.

14. The method according to claim 1, wherein a depth of the trench is 30 to 50 µm.

15. A method of manufacturing a semiconductor device, comprising:
    forming a trench in a first principal surface of a substrate;
    bonding a supporting substrate, a side edge of which is covered with a protective film, onto the first principal surface of the substrate through an adhesion layer; and
    grinding the substrate from a side of a second surface of the substrate opposed to the first principal surface thereof in a thickness direction of the substrate and exposing a bottom of the trench,
    wherein a side surface of the substrate is uncovered with the protective film.

16. The method according to claim 15, wherein the trench is made to be annular in shape when viewed oppositely to the first principal surface of the substrate, and
    an insulating film is formed so as to fill the trench, to form an insulating ring.

17. The method according to claim 15, wherein a conductive material is formed so as to fill the trench, to form a through substrate via.

18. A method of manufacturing a semiconductor device, comprising:
    attaching a supporting substrate to a first principal surface of a wafer, the supporting substrate having a diameter larger than that of the wafer and including a side edge covered with a protective film, the wafer including a trench formed in the first principal surface thereof; and etching the wafer from a second principal surface opposed to the first principal and exposing the trench under a condition that the supporting substrate is attached to the wafer, wherein a side surface of the wafer is uncovered with the protective film.

19. The method according to claim 18, wherein the trench is made to be annular in shape when viewed oppositely to the first principal surface of the wafer, and an insulating film is formed so as to fill the trench, to form an insulating ring.

20. The method according to claim 18, wherein a conductive material is formed so as to fill the trench, to form a through substrate via.

* * * * *